United States Patent [19]

Kalejs

[11] Patent Number: 5,558,712
[45] Date of Patent: Sep. 24, 1996

[54] CONTOURED INNER AFTER-HEATER SHIELD FOR REDUCING STRESS IN GROWING CRYSTALLINE BODIES

[75] Inventor: Juris P. Kalejs, Wellesley, Mass.

[73] Assignee: ASE Americas, Inc., Billerica, Mass.

[21] Appl. No.: 334,753

[22] Filed: Nov. 4, 1994

[51] Int. Cl.$^6$ ................................................. C30B 35/00
[52] U.S. Cl. ............................. 117/209; 117/23; 117/200
[58] Field of Search ................................. 117/23, 25, 200, 117/209, 900; 148/122; 437/2

[56] References Cited

U.S. PATENT DOCUMENTS

| | | | |
|---|---|---|---|
| 4,440,728 | 4/1984 | Stormont et al. | 117/200 |
| 5,037,622 | 8/1991 | Harvey et al. | 117/200 |
| 5,106,768 | 4/1992 | Bathey et al. | 147/23 |
| 5,156,978 | 10/1992 | Bathey et al. | 437/2 |

*Primary Examiner*—Felisa C. Garrett
*Attorney, Agent, or Firm*—Pandiscio & Pandiscio

[57] ABSTRACT

An apparatus for growing hollow crystalline bodies by the EFG process, comprising an EFG die having a top surface shaped for growing a hollow crystalline body having a cross-sectional configuration in the shape of a polygon having n faces, and a radiation shield adjacent to and surrounded by the top end surface of the die, characterized in that the shield has an inner edge defining a similar polygon with n sides, and the inner edge of the shield is notched so that the spacing between the n faces and the n sides is greatest between the central portions of the n faces and the n sides, whereby the greater spacing at the central portions helps to reduce lateral temperature gradients in the crystalline body that is grown by use of the die.

9 Claims, 3 Drawing Sheets

CONTOURED INNER AFTER-HEATER SHIELD FOR REDUCING STRESS IN GROWING CRYSTALLINE BODIES

This invention was made under Department of Energy Subcontract No. NREL-ZM-2-11040-3.

FIELD OF THE INVENTION

This invention relates to growing crystalline bodies from a melt and more particularly to an improvement in an apparatus for growing hollow tubular crystals and reducing thermoelastic stress acting on such crystals.

BACKGROUND OF THE INVENTION

A widely used technique for growing tubular crystalline bodies from a melt is the edge-defined, film-fed, crystal growth technique (the EFG process). A customary use of the EFG process is to grow hollow crystalline bodies having a polygonal cross-section, such as "octagons" or "nonagons", for solar cell manufacture. The hollow bodies are grown on a seed from a liquid film of feed material which is transported by capillary action from a crucible containing a quantity of molten material, such as a silicon melt, to the top end of a die having the desired cross-sectional shape. A pulling mechanism is employed for drawing the crystalline body away from the die until a desired length is reached, at which time the crystalline body is removed from the apparatus and a new one drawn. The thus grown hollow tube is then subdivided into a plurality of flat substrates or wafers that are used to form photovoltaic solar cells.

The apparatus used in growing hollow polygonally-shaped crystalline bodies of silicon and the like by the EFG method customarily includes a radiation shield mounted to the crucible inside of the EFG die tip, an inner after-heater that is surrounded by the growing crystalline body and an outer after-heater that surrounds the growing crystalline body, as shown by U.S. Pat. Nos. 4,440,728 issued to R. W. Stormont et al, 4,661,324 issued to N. C. Sink et al, 5,106,763 issued to B. R. Bathey et al, 5,098,229 issued to F. U. Meier et al, and 5,102,494 issued to D. S. Harvey et al.

Residual stresses tend to be present in such hollow bodies as a result of non-uniform changes in temperature of the crystalline body during growth, which can result in or promote buckling, non-flat faces, fracture, plastic flow or creep of the hollow body during growth or during subsequent handling and processing, e.g., during laser cutting into solar blanks.

A number of methods have been proposed to reduce the formation of residual stresses when growing sheet crystals. Annealing the sheet crystal has been suggested. It was expected that annealing at a temperature high enough so that stress relaxation could occur, but lower than its melting point, would relieve residual stresses in grown crystals. However, such a process is not effective in crystals with stresses above 20,000 psi, for example. In any event, annealing means an extra step that is added to the growth process, and thus adds unwanted cost.

U.S. Pat. No. 4,158,038, issued to Jewett, proposed that a crystal temperature profile controller be employed which would provide a substantially linear temperature gradient along the length of a crystalline body as the body is progressively pulled from the growth interface, so as to reduce thermal stresses in the crystalline body. Such a controller consists of a heater which is disposed along the pulling axis of the crystal close to but downstream of the melt/growth interface, with the downstream (higher above the interface) end of the controller being at a substantially lower temperature than the upstream (closer to the interface) end of the controller. The predominant heat flow process along the length of the heater is by conduction and radiation so that it exchanges heat with the moving crystal body. Therefore, the controller induces a thermal distribution lengthwise along the crystal body closely corresponding to its own. However, the Jewett et al device was designed to reduce temperature induced stresses along the length of the growing body and not to lateral stresses. Still other efforts have been made to reduce residual stresses in crystalline bodies grown by the EFG process.

In any event prior efforts have not fully solved the problem of relieving thermoelastic stress along the faces of the polygonally shaped hollow bodies. It has been found that in growing crystalline silicon hollow bodies using prior known apparatus, heat transfer at the corners of the faces is greater than at their center. As a result, uneven heat transfer occurs across the face of the crystal which results in thermal stresses that promote buckling or fracture of the hollow body.

OBJECTS AND SUMMARY OF THE INVENTION

The primary object of the present invention is to provide apparatus for growing hollow tubular crystalline bodies having a polygonal cross-section, wherein the temperature gradient across the faces of said bodies is modified in a desired manner so as to reduce residual stresses in the crystalline bodies.

A still further object of the invention is to produce flatter wafers from hollow tubular crystalline bodies grown by the EFG process.

These and other objects hereinafter described or rendered obvious are achieved by increasing the horizontal separation between (a) portions of the outer edges of the aforementioned radiation shield and (b) the die tip and the growing hollow polygonally-shaped crystalline body, except at the corners of the die tip and said body. Such an arrangement is brought about by providing a cut-back portion or "notch" in the outer edge of the shield opposite the center of each face of the polygonally shaped die. As a result, the center region of each die face will get hotter in relation to the edge regions of those faces, thus causing the meniscus between the die and the growing crystalline body to be at a higher temperature intermediate the corners of the die.

BRIEF DESCRIPTION OF THE DRAWINGS

A complete understanding of the nature and objects of the present invention will become more readily apparent, or will be rendered obvious, upon a reading of the detailed description of a preferred embodiment following hereinafter, and upon an examination of the accompanying drawings, in which like parts are identically numbered, and wherein.

DETAILED DESCRIPTION OF THE PREFERRED EMBODIMENT

Figure 1:
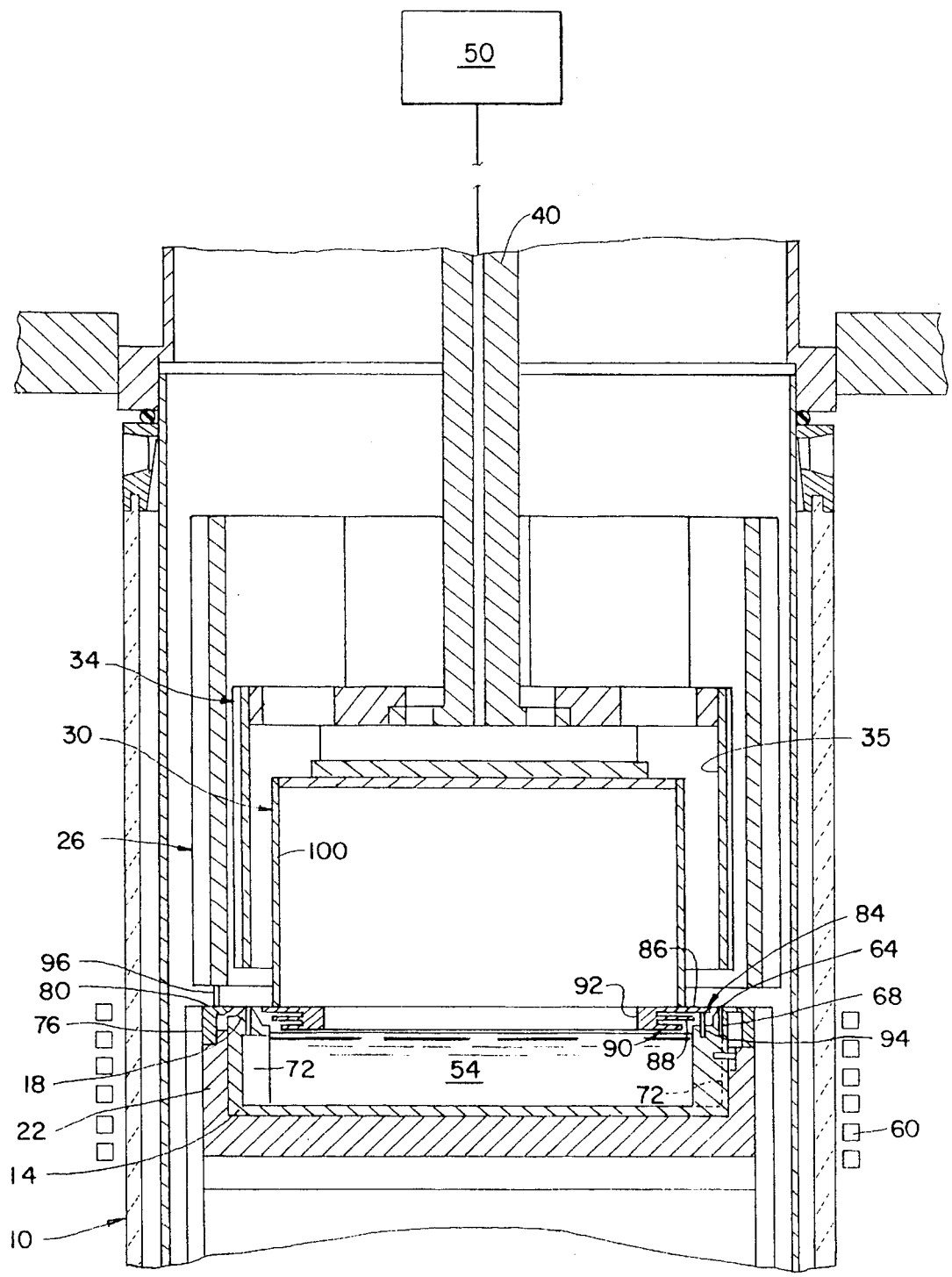
FIG. 1 is a fragmentary sectional elevational view of a conventional furnace employed in practicing the EFG process, with certain parts represented schematically.

Although the specific form of apparatus illustrated in the drawings and hereinafter described is designed to grow an octagon shaped hollow tube, it is to be understood that the present invention is adapted for use in growing crystalline bodies of other cross-sectional shapes.

Referring now to FIG. 1, there is shown a typical EFG crystal growing apparatus comprising a furnace enclosure 10, within which is disposed a crucible/die assembly 14 which preferably is made according to U.S. Pat. No. 5,037,622, issued 6 Aug. 1991 to David S. Harvey et al. for "Wet-Tip Die For EFG Crystal Growth Apparatus", a heat susceptor 22, outer and inner after-heater assemblies 26 and 30, and seed assembly 34. The seed assembly 34 is supported by a movable stem 40 attached to a pulling mechanism 50 (see U.S. Pat. No. 4,440,728 issued 3 Apr. 1984 to Richard W. Stormont et al for "Apparatus For Growing Tubular Crystalline Bodies" for details of the seed assembly). The crucible portion of crucible/die assembly 14 is normally filled with a charge 54 of the material to be grown. The furnace enclosure 10 is surrounded by an RF heating coil 60, which serves to melt the charge 54 and maintain it in molten state.

Figure 2:
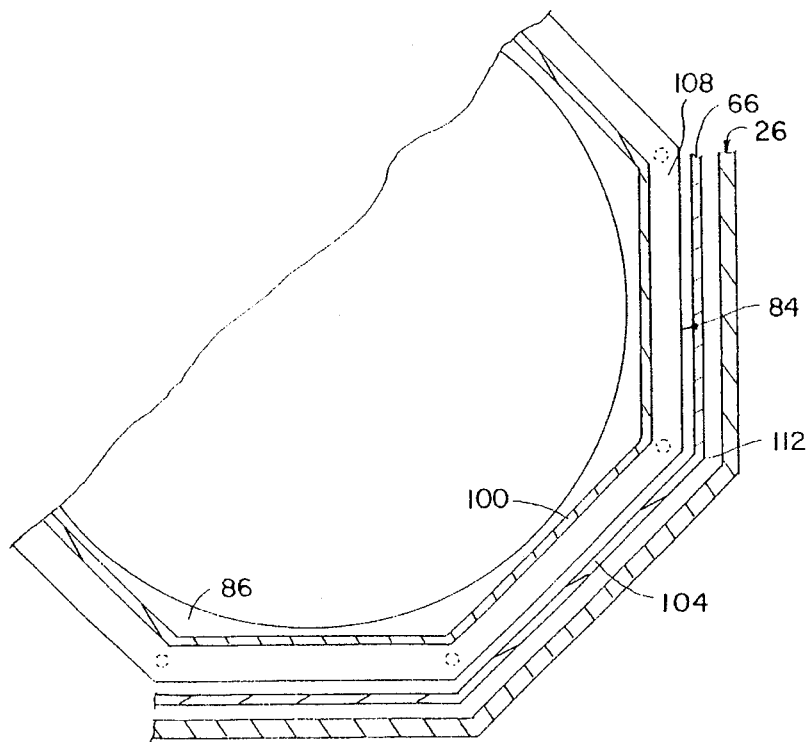
FIG. 2 is a plan view of a known (prior art) inner radiation shield usable in the furnace shown in FIG. 1.
Figure 3:
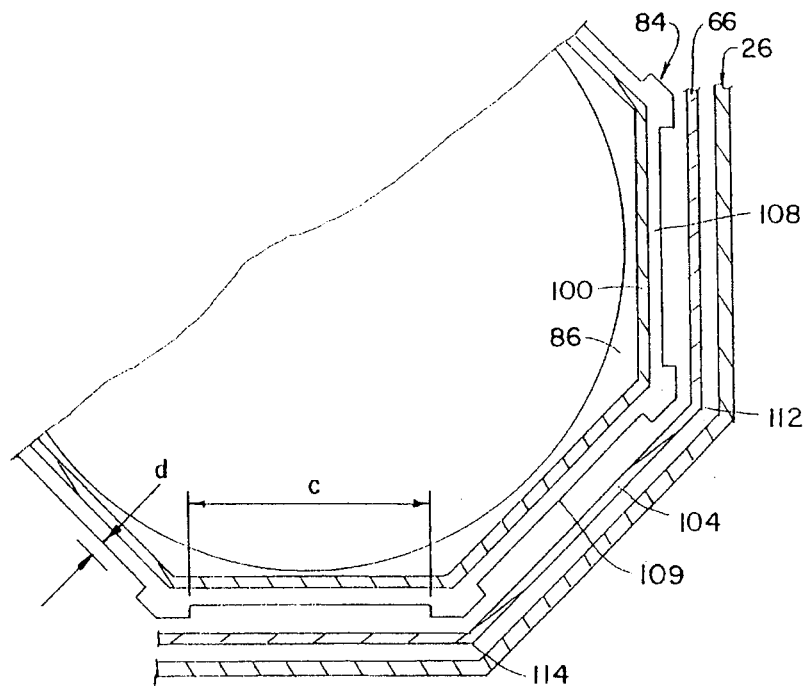
FIG. 3 is a plan view, similar to that of FIG. 2, showing an inner radiation shield constituting a preferred embodiment of the present invention.

The capillary die portion 18 of the crucible/die assembly is provided with an upper end face 64 shaped and dimensioned to determine the form and size of the grown crystalline body 66 (see FIGS. 2 and 3). Preferably the die end face 64 has the shape of an octagon, whereby to promote growth of a hollow thin-walled octagon. End face 64 is further provided with a capillary gap 68 of similar form centered in the face. A plurality of elongate slots 72 are formed on the inside of the side wall of crucible 14 to prove communication between the capillary gap 68 and the interior of the crucible 14, so that the melted charge can flow to the capillary gap and thence rise by capillary action to replenish the material on the die end face 64 as the body 66 is grown.

Mounted on the top end of susceptor 22 is an outer radiation shield 76 in the form of a thin-walled hollow cylinder or prism of similar shape and outside dimension as susceptor 22 and with a flange 80 having an inner edge with the same polygonal configuration as end face 64.

An inner radiation shield 84 is mounted to the interior of capillary die 18 in spaced apart relationship from the die by means of a plurality of pins 94 disposed about the inner periphery of die 18. The inner radiation shield 84 is formed of one or more graphite rings (86, 88, 90) held together in vertically spaced apart opposing relationship. The outside configuration of the inner radiation shield is of similar form but smaller than that of the end face 64 when viewed in plan view (see FIG. 2). The inner edges of such rings may be circular in form.

The outer after-heater 26 and the inner after-heater 30 are disposed above, and in concentric relation to die end face 64, with outer after-heater 26 being disposed outside of an axial projection of the die end face and inner after-heater 30 being disposed inside of an axial projection of the die end face. Outer after-heater 26 is a hollow body having a cross-sectional configuration that preferably is similar to but larger than the configuration of die end face 64. The corresponding faces of after-heater 26 are arranged parallel to the corresponding sides of the octagon 66 (FIG. 2) grown from end face 64 and extend substantially normal to the plane of the end face. Outer after-heater 26 is supported on outer radiation shield 76 by a plurality of pins 96 that engage outer radiation shield 76 and hold the after-heater clear of that shield.

Figure 4:
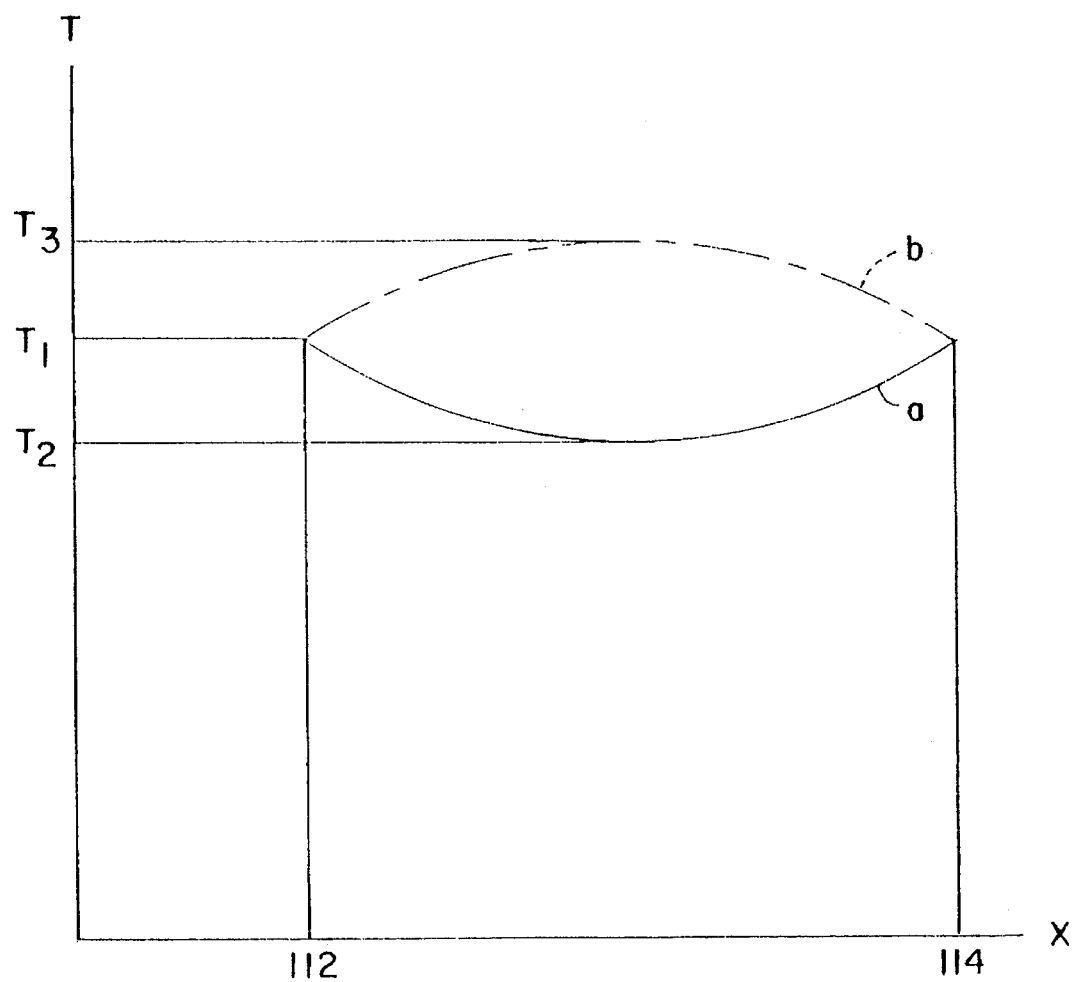
FIG. 4 provides two curves illustrating the temperature gradient across the faces of a polygonally shaped crystal using the old and new heat shields shown in FIGS. 2 and 3.

Inner after-heater 30 includes a thin polygonally shaped wall 100 of smaller outside diameter than the circle which can be inscribed within the sides of the polygon defined by the outer edge configuration of die end face 64. The axis of the wall 100 is substantially normal to the plane of end face 64. Inner after-heater 30 is supported on the topmost ring 86 of inner radiation shield 84, preferably centrally of such ring, as shown in FIGS. 2 and 4. The interior of crucible 14 communicates with the interior of the after-heater through the central opening 92 in inner radiation shield 84.

The apparatus thus described above is placed in use by introducing a charge 54 into the crucible, heating that charge so that it becomes molten, and also heating the die face 64 above the melting point of the material of the seed 35 carried by seed assembly 34. The portion of the seed contacting the die end face will melt, wetting the end face and merging with the melt in capillary gap 68 so as to form a thin film of melt on end face 64. The pulling mechanism 50 is activated to raise stem 40 and the seed assembly 34. As seed assembly 34 rises from the die, a crystalline body is grown from the thin film on the die end face and melted charge 54 in capillary 68 rises to replenish the material consumed in growing the crystalline body.

Thermal control of the growing crystal is provided by after-heaters 26 and 30. The after-heaters 26 and 30 serve in effect as susceptors, and are heated primarily by induction from RF as a result of energization of coil 60.

A long-standing objective has been to provide a growing zone of substantially constant temperature horizontally along die end face 64. Despite prior efforts to achieve such a result, it has been found that at the growth interface a polygonally-shaped crystalline body of silicon, such as one having the octagonal configuration shown in the drawings, exhibits a higher temperature at its corners than in the center of each of its faces if the inner radiation shield has straight inner edges. Such a temperature gradient is depicted by curve "a" in FIG. 4, wherein it is seen that at the growth interface the center of a face 104 (FIG. 2) of a growing crystal 66 has a lower temperature than its opposite edges 112, 114. Thus the temperature gradient across a face of a growing polygonally-shaped crystalline body assumes a "smiling" appearance such as shown at curve "a" in FIG. 4, when employing inner radiation shields having straight edges. The lower temperature $T_2$ experienced at the center of the face 104, as compared to the temperature $T_1$ at its edges, tends to cause thermoelastic stress that may result in buckling or cracking of that face. Therefore, in order to obtain less stress and flatter faces for the crystalline body, more heat must be put into the center portion of each face of the growing polygonally-shaped crystalline body at the growth interface.

By curving the transverse isotherms in the growing crystalline body close to the growth interface so that the horizontal temperature gradient has a "frowning" shape as represented by curve "b" in FIG. 4, a lowering of stress is obtained in the faces of a growing polygonally shaped crystal. This will reduce the amplitude of any buckle and make the resulting wafers flatter and less susceptible to fracture.

I have discovered that it is possible to decrease the thermoelastic stress acting on the faces of a polygonally shaped crystal by shaping the outside edge or lip of the shield 84 to permit more heat to reach the center of each face of the growing body from the melt, so that the center of the faces become at least as hot as, and preferably hotter than, their edges, e.g., so as to obtain a transverse temperature gradient like the one illustrated by curve "b" on FIG. 4.

FIGS. 2 and 3 provide a comparison that helps distinguish the present invention. FIG. 2 shows the prior art arrangement wherein the top ring 86 of the inner shield 84 extends beyond the outer margin of the inner after-heater 30 that it supports. The outer peripheral portion 108 of ring 86 has an octagonal edge configuration conforming to the shape of the growing crystalline body, and the top die surface from which the body is grown. FIG. 3 shows how the outer edge of heat shield 84 is notched in a manner designed to provide the "frowning" curve "b" of FIG. 4. More specifically, in FIG. 3 the peripheral portion 108 of shield 84 is notched at the center of each of its faces, so as to form recessed areas 109. The recesses 109 are evenly spaced between the corners formed by the side edge faces of the shield. These recesses have the effect of altering the transverse isotherms, by virtue of the fact that the recesses allow more heat to be radiated from the melt 54 in the crucible toward the centers of the faces of the growing body 66 near the growth interface, thus providing a temperature distribution horizontally along the growth interface that has the effect of reducing stresses in the crystalline body.

By way of a specific example of the embodiment shown in FIG. 3, in growing a silicon octagon having faces measuring approximately 10 cm wide, the radial dimension between the inner and outer edges of the top ring 86 of the inner after-heater shield 84 may be approximately 2.54 cm, and the inner after-heater may be placed on the top ring 86 so that the peripheral portion 108 protrudes about 1.24 cm beyond the outer periphery of the inner after-heater, shield 84 is positioned vertically so that ring 86 is substantially in the same plane as the growth interface, and its outer edge is cut back over a span preferably in the range of 5–8 cm (preferably the notches 109 have a span of about 7.6 cm or 3.0 in.), and the depth of the recess cut on the edge of ring 86 does not exceed 10 mm. (preferably recesses 109 have a depth of about 7.6 mm. or 0.3 in. opposite the center of the face of the octagon).

Although a specific preferred embodiment of the present invention has been described and illustrated herein, it should be appreciated that modifications and variations may be readily made by those skilled in the art without departing from the spirit and scope of the invention. For example, the invention may be applied to growing ribbons or any polygonally shaped crystal. Also, although the invention has been illustrated and described in relation to growing octagons, it is to be understand that the invention is applicable to EFG apparatus for growing polygonally shaped hollow bodies having n sides or faces, where n is an integer with a value of three or more, but preferably has a value of eight or nine. Still other changes and modifications of the present invention will be obvious to persons skilled in the art from the foregoing description.

What is claimed is:

1. Apparatus for growing hollow crystalline bodies from a melt, said apparatus including in combination:

a furnace containing a crucible for holding a melt of material to be used to form said crystalline body;

a capillary die having an end face in the form of a selected polygon and capillary means for feeding melt from said crucible to said end face;

means for (a) holding an elongate hollow tubular seed of selected cross-sectional configuration in contact with a film of melt on said end face, and (b) moving said seed vertically away from said end face so as to grow a hollow crystalline body from said film of melt;

a radiation shield disposed interior to said capillary die end face and supported in such manner as to be clear of any contact with but at the same time confronting any melt in said crucible, said radiation shield having an outer edge configuration similar to said selected polygon and also having a central opening;

a hollow tubular inner after-heater so dimensioned as to be contained entirely within said tubular seed when said seed is in contact with a film of melt on said end face; said inner after-heater being supported on said radiation shield and having an interior in communication with said crucible through said opening in said radiation shield; and a hollow tubular outer after-heater surrounding and spaced from said inner after-heater, said outer after-heater being dimensioned so as to surround said seed when said seed is in contact with said film of melt;

said radiation shield having an outer edge formed by a plurality of faces that is contoured so as to provide a temperature gradient along the periphery of said die end face that minimizes thermal stresses along the growing crystalline body.

2. Apparatus according to claim 1 wherein said shield has n outer edge faces defining a polygon similar to said selected polygon, where n is an integer with a value of three or more, and each face of said shield is notched at its center so as to provide passageways for transmitting the heat from the melt in said crucible to said crystalline body.

3. Apparatus according to claim 2, wherein said shield comprises a series of vertically-spaced rings.

4. Apparatus according to claim 1 wherein said shield and said die end face have similar polygonal outer edge configurations, said polygonal configuration being defined by outer edge faces which form corners at their intersection with one another, and further wherein each of the edge faces of said shield is provided with a notch intermediate said corners that form passageways for passing heat from the melt in said crucible to said crystalline body.

5. Apparatus according to claim 4 wherein said notches have a depth of less than 10 mm.

6. Apparatus according to claim 4 wherein said notches have a depth of 7.6 mm.

7. Apparatus according to claim 4 wherein said notches have a length in the range of 5 to 8 cm.

8. Apparatus according to claim 4 wherein said notches have a depth of less than 10 mm. and a length in the range of 5 to 8 cm.

9. Apparatus according to claim 8 wherein said notches have a depth of 7.6 mm. and a length of 7.6 cm.

* * * * *